United States Patent
Shu et al.

(10) Patent No.: US 9,583,646 B2
(45) Date of Patent: Feb. 28, 2017

(54) BOTTOM-EMITTING SUBSTRATE, DISPLAY DEVICE AND MANUFACTURING METHOD OF SUBSTRATE

(71) Applicant: BOE TECHNOLOGY GROUP CO., LTD., Beijing (CN)

(72) Inventors: Shi Shu, Beijing (CN); Jingxia Gu, Beijing (CN); Xiangchun Kong, Beijing (CN); Feng Zhang, Beijing (CN); Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 14/417,355

(22) PCT Filed: Jun. 5, 2014

(86) PCT No.: PCT/CN2014/079287
§ 371 (c)(1),
(2) Date: Jan. 26, 2015

(87) PCT Pub. No.: WO2015/062271
PCT Pub. Date: May 7, 2015

(65) Prior Publication Data
US 2015/0380475 A1    Dec. 31, 2015

(30) Foreign Application Priority Data
Oct. 28, 2013 (CN) .......................... 2013 1 0517210

(51) Int. Cl.
*H01L 21/00* (2006.01)
*H01L 33/00* (2010.01)
(Continued)

(52) U.S. Cl.
CPC .... *H01L 31/02164* (2013.01); *H01L 27/3262* (2013.01); *H01L 27/3276* (2013.01); *H01L 51/5284* (2013.01)

(58) Field of Classification Search
CPC ...................... H01L 51/5284; H01L 31/02164
(Continued)

(56) References Cited

U.S. PATENT DOCUMENTS 6,380,559 B1 * 4/2002 Park .................... G02F 1/13458
257/59
6,791,633 B2 * 9/2004 Matsumoto ........... G02F 1/1345
349/42
(Continued)

FOREIGN PATENT DOCUMENTS

CN       1578569 A    2/2005
CN       1753586 A    3/2006
(Continued)

OTHER PUBLICATIONS

First Chinese Office Action Appln. No. 201310517210.3; Dated Jul. 1, 2015.
(Continued)

*Primary Examiner* — Calvin Lee
(74) *Attorney, Agent, or Firm* — Ladas & Parry LLP

(57) ABSTRACT

A bottom-emitting substrate, a display device and a method for manufacturing the bottom emitting substrate are provided. The bottom-emitting substrate comprises: a base substrate (1); a black matrix layer (2) with a plurality of opening regions and a plurality of non-opening regions disposed on the base substrate (1); and an array substrate unit disposed on the black matrix layer (2), projections of metal layers in the array substrate unit on the black matrix layer (2) locating within the plurality of non-opening regions of the black matrix layer (2). A method for manufacturing the bottom-emitting substrate and a display device comprising the bottom-emitting substrate are also provided.

18 Claims, 2 Drawing Sheets

(51) Int. Cl.
*H01L 31/0216* (2014.01)
*H01L 51/52* (2006.01)
*H01L 27/32* (2006.01)

(58) Field of Classification Search
USPC .................................... 438/29, 69; 257/98
See application file for complete search history.

(56) References Cited

U.S. PATENT DOCUMENTS

| | | | |
|---|---|---|---|
| 7,253,856 B2* | 8/2007 | Kim | G02F 1/136209 |
| | | | 349/110 |
| 7,321,406 B2* | 1/2008 | Lee | G02F 1/136209 |
| | | | 349/110 |
| 7,498,605 B2 | 3/2009 | Koo et al. | |
| 9,236,495 B2* | 1/2016 | Seo | H01L 29/66969 |
| 2007/0236141 A1 | 10/2007 | Lee et al. | |
| 2008/0042136 A1 | 2/2008 | Lee | |

FOREIGN PATENT DOCUMENTS

| | | |
|---|---|---|
| CN | 1917230 A | 2/2007 |
| CN | 103531610 A | 1/2014 |

OTHER PUBLICATIONS

International Search Report Appln. No. PCT/CN2014/079287; Dated Aug. 20, 2014.
Written Opinion of the International Searching Authority Appln. No. PCT/CN2014/079287; Dated Aug. 28, 2014.
Second Chinese Office Action Appln. No. 201310517210.3; Dated Mar. 2, 2016.

* cited by examiner

ND MANUFACTURING METHOD
BOTTOM-EMITTING SUBSTRATE, DISPLAY DEVICE AND MANUFACTURING METHOD OF SUBSTRATE

TECHNICAL FIELD

Embodiments of the present disclosure relate to a bottom-emitting substrate, a display device and a manufacturing method of the substrate.

BACKGROUND

Organic light emitting diodes (hereinafter referred to as OLED) panels have been applied widely due to their advantages of light weight, thin thickness, low power dissipation, pure color, wide viewing angle, and flexibility as compared to liquid crystal panels.

A bottom-emitting OLED panel known by the inventor adopts a white light OLED and color filter on array (hereinafter referred to as COA) technology, that is, the bottom-emitting OLED panel adopts a white light OLED and a COA substrate. The manufacturing process of the bottom-emitting OLED panel comprises: firstly forming an array substrate unit on the glass substrate through array process, then performing color filter process on the array substrate unit so as to incorporate the color filter on the array substrate unit, thereby forming a COA substrate through the two process steps, and then manufacturing an electroluminescence layer (hereinafter referred to as EL layer) on the color filter, and finally forming the OLED panel by encapsulation. Light emitted from the EL layer transmits the color filter, the array substrate unit and the glass substrate, and is perceived by an observer. Therefore, the above-mentioned OLED panel is referred to as bottom-emitting structure OLED panel or bottom-emitting OLED panel.

In order to relieve influence of reflected environment light, a polarizer sheet is generally attached to the bottom-emitting OLED panel at the observer side. However, the polarizer sheet would filter out 60% or so from exiting light, resulting in low light utilization. Without a polarizer sheet, although the light utilization is high, the metal layers such as gate layer, source/drain layer and active layer in the COA substrate could reflect environment light, hence reducing the contrast and color gamut of the bottom-emitting OLED panel and impacting the display effect of the bottom-emitting OLED panel. Therefore, how to provide a bottom-emitting substrate with high light utilization capable of relieving influence of reflection of ambient light becomes a concern of those skilled in the art.

SUMMARY

An object of the present disclosure is to improve light utilization ratio in the bottom-emitting OLED panel and relieve influence of ambient light reflection, hence improving the display effect of the display device.

In order to achieve the objects mentioned above, at least one embodiments of the present disclosure provide a bottom-emitting substrate comprising:

a base substrate;

a black matrix layer disposed on the base substrate and having a plurality of opening regions and a plurality of non-opening regions;

an array substrate unit disposed on the black matrix layer such that metal layers in the array substrate unit have projections on the black matrix layer within a plurality of non-opening regions of the black matrix layer.

In one embodiment of the present disclosure, in the black matrix layer, the plurality of opening regions are arranged in an array and the plurality of opening regions are arranged between the plurality of non-opening regions alternatively.

In one embodiment of the present disclosure, the array substrate can further comprises:

gate lines and a gate layer disposed on the black matrix layer, projections of the gate lines and the gate layer on the black matrix layer within the plurality of non-opening regions of the black matrix layer;

a gate insulating layer covering the gate layer;

an active layer disposed over the gate insulating layer, a projection of the active layer on the black matrix layer locating within the plurality of non-opening regions of the black matrix layer;

data lines and a source/drain layer disposed on the active layer, projections of the data lines and the source/drain layer on the black matrix layer locating within the plurality of non-opening regions of the black matrix layer;

and a passivation layer covering the source/drain layer.

Furthermore, the bottom-emitting substrate further comprises: a color filter disposed on the array substrate unit and a transparent electrode layer disposed on the color filter.

At least one embodiment of the present disclosure further provides a display device comprising the bottom-emitting substrate with the technical features mentioned above.

At least one embodiment of the present disclosure further provides a method for manufacturing a bottom-emitting substrate, comprising:

forming a black matrix layer with a plurality of opening regions and a plurality of non-opening regions on a base substrate;

forming an array substrate unit on the black matrix layer such that projections of metal layers in the array substrate unit on the black matrix layer locate within a plurality of non-opening regions of the black matrix layer.

In one embodiment of the present disclosure, forming a black matrix layer with a plurality of opening regions and a plurality of non-opening regions on a base substrate comprises:

forming a black photoresist layer on the base substrate;

forming a black matrix layer with a plurality of opening areas and a plurality of non-opening areas through an etching process utilizing a mask.

In one embodiment of the present disclosure, forming an array substrate unit on the black matrix layer comprises:

forming patterned gate lines and a patterned gate layer on the black matrix layer, projections of the gate lines and the gate layer on the black matrix layer locating within the plurality of non-opening areas of the black matrix layer;

forming a gate insulating layer covering the gate layer;

forming a patterned active layer on the gate insulating layer, a projection of the active layer on the black matrix layer locating within the plurality of non-opening areas of the black matrix layer;

forming patterned data lines and a patterned source/drain layer on the active layer, projections of the data lines and the source/drain layer on the black matrix layer locating within the plurality of non-opening regions of the black matrix layer;

and forming a passivation layer on the source/drain layer.

Furthermore, the method for manufacturing bottom-emitting substrate further comprises:

forming a color filter on the array substrate unit; and forming a transparent electrode layer on the color filter.

In the bottom-emitting substrate according to embodiments of the present disclosure, a black matrix layer with a plurality of opening regions and a plurality of non-opening regions is disposed between a base substrate and an array substrate unit, and projections of metal layers in the array substrate unit on the black matrix layer locates within the plurality of non-opening regions of the black matrix layer. Since the black matrix layer has a low reflection feature, it can prevent metal layers from reflecting ambient light, thus influence of ambient light reflection is relieved and in turn contrast and color gamut are improved. In addition, no polarizer sheet is required any more, and it is possible to improve light utilization and improve the display effect of the display device in turn.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In order to improve light utilization and relieve influence of ambient light reflection and improve display effect of a display device in turn, embodiments of the present disclosure provide a bottom-emitting substrate with a black matrix layer disposed between a base substrate and an array substrate unit, wherein the black matrix layer has a plurality of opening regions and a plurality of non-opening regions, projections of metal layers in the array substrate unit on the black matrix layer locates within the plurality of non-opening regions of the black matrix layer. Due to the low reflection feature of the black matrix layer, it is possible to relieve influence of ambient light reflection and thereby enhance the contrast and color gamut. Furthermore, no polarizer sheet is required, which can further improve light utilization and the display effect of the display device.

Figure 1:
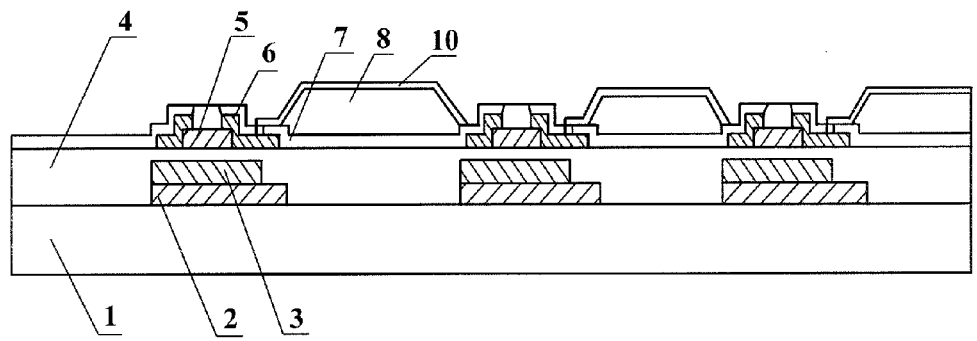
FIG. 1 is a transverse sectional view of a bottom-emitting substrate according to an embodiment of the present disclosure.
Figure 2:
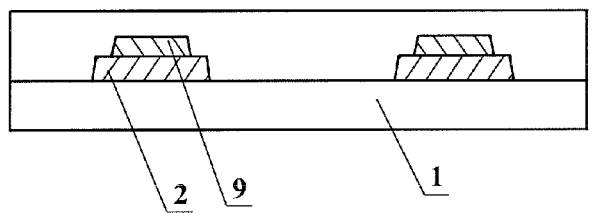
FIG. 2 is a longitudinal sectional view of a bottom-emitting substrate according to an embodiment of the present disclosure.
Figure 3:
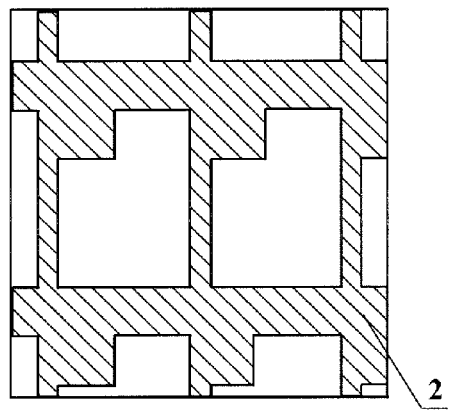
FIG. 3 is a top view of a black matrix layer in FIG. 2.

Refer to FIGS. 1, 2 and 3, wherein FIG. 1 is a transverse sectional view of a bottom-emitting substrate according to an embodiment of the present disclosure, FIG. 2 is a longitudinal sectional view of a bottom-emitting substrate according to an embodiment of the present disclosure; and FIG. 3 is a top view of a black matrix layer in FIG. 2. The bottom-emitting substrate according to an embodiment of the present disclosure comprises: a base substrate 1, a black matrix layer 2 with a plurality of opening regions and a plurality of non-opening regions disposed on the base substrate 1; and an array substrate unit disposed on the black matrix layer 2, projections of metal layers on the black matrix layer 2 locating within the plurality of non-opening regions of the black matrix layer 2.

In practice, a black matrix layer 2 with a plurality of opening regions and a plurality of non-opening regions is disposed between the base substrate 1 and the array substrate unit, and projections of metal layers in the array substrate unit on the black matrix layer 2 locate within the plurality of non-opening regions of the black matrix layer 2. As illustrated in FIG. 2, regions designated by hatching lines are non-opening regions and regions not designated by hatching lines are opening regions. In more detail, in the bottom-emitting substrate, the non-opening regions in the black matrix layer 2 have a pattern shape that is superposition of pattern shapes of all metal layers such as gate lines and gate layers, and data lines and source/drain layers to ensure that patterns of the black matrix layer 2 exist right under all the metal layers; that is, the black matrix layer 2 has a structure determined by shapes of the projection of metal layers in the array substrate unit on the base substrate 1. For example, projections of each metal layer in the array substrate unit on the base substrate 1 have a shape of a plurality of rectangles arranged in an array, then shapes of non-opening regions in the black matrix layer 2 are also rectangles that are also arranged in an array. Referring to FIG. 2 again, in an implementation, the plurality of non-opening regions in the black matrix layer 2 are arranged in an array and the plurality of opening regions are arranged between the plurality of non-opening regions alternatively.

Projections of metal layers in the array substrate unit on the black matrix layer 2 locate within the plurality of non-opening regions of the black matrix layer 2, and since the material of the black matrix layer 2 has a low reflection feature, it is possible to prevent metal layers from reflecting ambient light and relieve influence of ambient light reflection. Therefore, contrast and color gamut can be improved, in addition, since no polarizer sheet is required, light utilization is improved. Therefore, the display effect of a display device can be improved significantly with the display device using the bottom-emitting substrate mentioned above.

It should be noted that in the bottom-emitting substrate mentioned above, each pixel unit corresponds to two thin film transistors (TFT). However, it is not limited thereto, and each pixel unit in the bottom-emitting substrate can also correspond to more than two TFTs, which is not limited here.

Referring to FIG. 1 again, the array substrate unit comprises: gate lines and gate layer 3 disposed on the black matrix layer 2, projections of the gate lines and the gate layer 3 on the black matrix layer 2 locating within the plurality of non-opening regions of the black matrix layer 2; a gate insulating layer 4 covering the gate layer 3; an active layer 5 disposed on the gate insulating layer 4, a projection of the active layer 5 on the black matrix layer 2 locating within the plurality of non-opening regions of the black matrix layer 2; data lines and source/drain layer 6 disposed on the active layer 5, projections of the data lines and the source/drain layer 6 on the black matrix layer 2 locating within the plurality of non-opening regions of the black matrix layer 2; and a passivation layer 7 covering the source/drain layer 6.

The bottom-emitting substrate mentioned above can further comprise a color filter 8 disposed on the array substrate unit and a transparent electrode layer 10 disposed on the color filter 8. For example, the color filter 8 is located on the passivation layer 7 and the transparent electrode layer 10 is located on the color filter 8. The transparent electrode layer 10 can be a cathode layer or an anode layer of the OLED. This kind of bottom-emitting substrate is also referred to as color filter on array substrate, namely COA substrate. It should be noted that, the bottom-emitting substrate mentioned above needs a color filter provided in the bottom-emitting substrate to achieve color display only when using a white light OLED, and it can achieve color display without disposing a color filter in the bottom-emitting substrate when a colorful OLED is used in the bottom-emitting substrate.

At least one embodiment of the present disclosure further provides a display device comprising the bottom-emitting substrate with the features mentioned above. Here, the display device can be any product or component with display function, such as a cell phone, a tablet PC, a TV set, a display device, a laptop, a digital picture frame and a navigator and etc.

Figure 4:
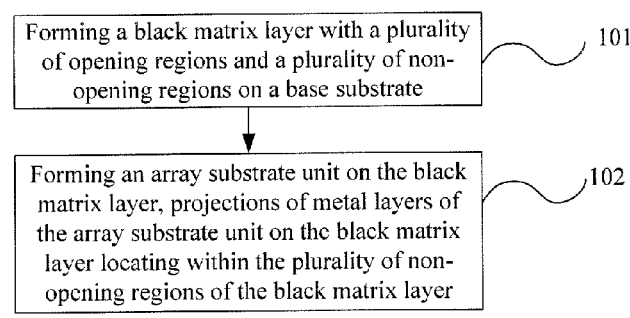
FIG. 4 is a flow chart illustrating a method for manufacturing a bottom-emitting substrate according to an embodiment of the present disclosure.
Figure 5:
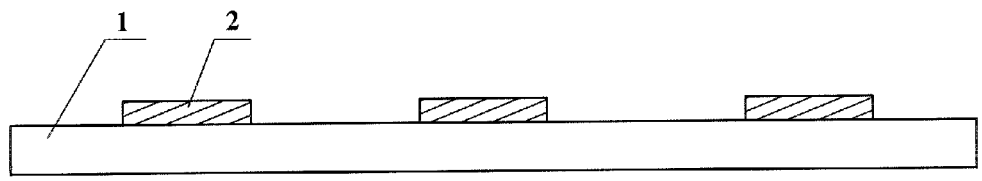
FIG. 5 is a sectional view of a bottom-emitting substrate formed with a black matrix layer.
Figure 6:
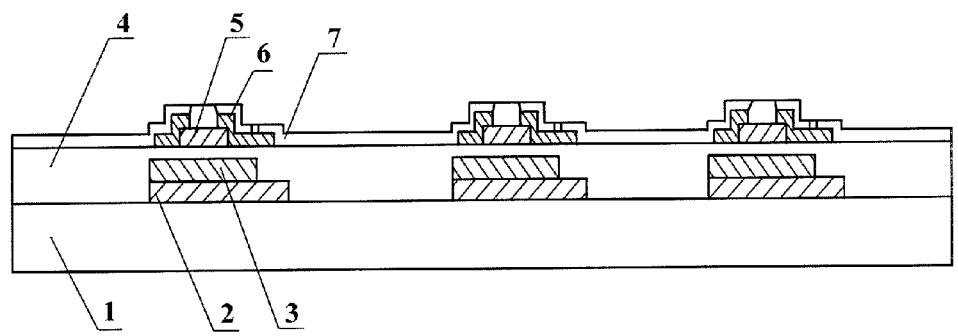
FIG. 6 is a sectional view of a substrate formed with an array substrate unit over the black matrix layer.

At least one embodiment of the present disclosure further provides a method for manufacturing a bottom-emitting substrate. Refer to FIGS. 4~6, wherein FIG. 4 is a flow chart of a method for manufacturing a bottom-emitting substrate according to an embodiment of the present disclosure; FIG. 5 is a sectional view of a bottom-emitting substrate formed with a black matrix layer; and FIG. 6 is a sectional view of a substrate formed with an array substrate unit on the black matrix layer. The method according to at least one embodiment of the present disclosure comprises:

101, forming a black matrix layer 2 with a plurality of opening regions and a plurality of non-opening regions on the base substrate 1, as illustrated in FIG. 5.

102, forming an array substrate unit on the black matrix layer 2, projections of metal layers in the array substrate unit on the black matrix layer 2 locating within the plurality of non-opening regions of the black matrix layer 2, as illustrated in FIG. 6.

For example, forming a black matrix layer 2 with a plurality of opening areas and a plurality of non-opening areas on the base substrate 1 comprises: forming a black photoresist layer on the base substrate 1; and forming a black matrix layer 2 with a plurality of opening regions and a plurality of non-opening regions through an etching process utilizing a mask. The black photoresist layer, the mask and the etching process are well known by those skilled in the art and will not be described in detail here.

In one implementation, forming an array substrate unit on the black matrix layer 2 comprises: forming patterned gate lines and a patterned gate layer 3 on the black matrix layer 2, projections of the gate lines and the gate layer on the black matrix layer 2 locating within the plurality of non-opening regions of the black matrix layer 2; forming a gate insulating layer 4 covering the gate layer 3; and forming a patterned active layer 5 on the gate insulating layer 4, a projection of the gate insulating layer on the black matrix layer 2 locating within the plurality of non-opening regions of the black. matrix layer 2; and forming patterned data lines and a patterned source/drain layer 6 on the active layer 5, projections of the data lines and the source/drain layer on the black matrix layer 2 locating within the plurality of non-opening regions of the black matrix layer; and forming a passivation layer on the source/drain layer 6. That is, in the bottom-emitting substrate, the pattern profile of non-opening regions in the black matrix layer 2 is a superposition of pattern profiles of all the metal layers such as gate lines and gate layer, and data lines and source/drain layer to ensure patterns of the black matrix layer 2 exists right under all the metal layers.

In summary, in the bottom-emitting substrate according to at least one embodiment of the present disclosure, a black matrix layer with a plurality of opening regions and a plurality of non-opening regions is disposed between the base substrate and the array substrate unit, and projections of each metal layer in the array substrate unit on the black matrix layer locates within the plurality of non-opening regions of the black matrix layer. Since the black matrix layer has a low reflection feature, it can prevent metal layers from reflecting ambient light, relieve the influence of ambient light reflection and enhance contrast and color gamut. In addition, since no polarizer sheet is required any more, it is possible to improve light utilization and improve the display effect of the display device in turn.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201310517210.3 filed on Oct. 28, 2013, the disclosure of which is hereby entirely incorporated by reference.

The invention claimed is:

1. A method for manufacturing a bottom-emitting substrate, comprising:
   forming a black matrix layer with a plurality of opening regions and a plurality of non-opening regions on a base substrate; and
   forming an array substrate unit on the black matrix layer, projections of metal layers in the array substrate unit on the black matrix layer locating within a plurality of non-opening regions of the black matrix layer.

2. The method according to claim 1, further comprising:
   forming a color filter on the array substrate unit; and
   forming a transparent electrode layer on the color filter.

3. The method according to claim 1, wherein forming an array substrate unit on the black matrix layer comprises:
   forming patterned gate lines and a patterned gate layer on the black matrix layer, projections of the gate lines and the gate layer on the black matrix layer locating within the plurality of non-opening regions of the black matrix layer;
   forming a gate insulating layer covering the gate layer;
   forming a patterned active layer on the gate insulating layer, a projection of the active layer on the black matrix layer locating within the plurality of non-opening regions of the black matrix layer;
   forming patterned data lines and a patterned source/drain layer on the active layer, projections of the data lines and the source/drain layer on the black matrix layer locating within the plurality of non-opening regions of the black matrix layer; and
   forming a passivation layer on the source/drain layer.

4. The method according to claim 3, further comprising:
   forming a color filter on the array substrate unit; and
   forming a transparent electrode layer on the color filter.

5. The method of claim 1, wherein forming a black matrix layer with a plurality of opening regions and a plurality of non-opening regions on the base substrate comprises:
   forming a black photoresist layer on the base substrate; and forming a black matrix layer with a plurality of opening regions and a plurality of non-opening regions through an etching process utilizing a mask.

6. The method according to claim 5, wherein forming an array substrate unit on the black matrix layer comprises:
forming patterned gate lines and a patterned gate layer on the black matrix layer, projections of the gate lines and the gate layer on the black matrix layer locating within the plurality of non-opening regions of the black matrix layer;
forming a gate insulating layer covering the gate layer;
forming a patterned active layer on the gate insulating layer, a projection of the active layer on the black matrix layer locating within the plurality of non-opening regions of the black matrix layer;
forming patterned data lines and a patterned source/drain layer on the active layer, projections of the data lines and the source/drain layer on the black matrix layer locating within the plurality of non-opening regions of the black matrix layer; and
forming a passivation layer on the source/drain layer.

7. The method according to claim 5, further comprising:
forming a color filter on the array substrate unit; and
forming a transparent electrode layer on the color filter.

8. A bottom-emitting substrate comprising:
a base substrate;
a black matrix layer with a plurality of opening regions and a plurality of non-opening regions disposed on the base substrate; and
an array substrate unit disposed on the black matrix layer, projections of metal layers in the array substrate unit on the black matrix layer locating within the plurality of non-opening regions of the black matrix layer.

9. A display device comprising the bottom-emitting substrate according to claim 8.

10. The bottom-emitting substrate according to claim 8, further comprising: a color filter disposed on the array substrate unit and a transparent electrode layer disposed on the color filter.

11. A display device comprising the bottom-emitting substrate according to claim 10.

12. The bottom-emitting substrate according to claim 8, wherein the array substrate may further comprises:
gate lines and a gate layer disposed on the black matrix layer, projections of the gate lines and the gate layer on the black matrix layer locating within the plurality of non-opening regions of the black matrix layer;
a gate insulating layer covering the gate layer;
an active layer disposed on the gate insulating layer, projections of the active layer on the black matrix layer locating within the plurality of non-opening regions of the black matrix layer;
data lines and a source/drain layer disposed on the active layer, projections of the data lines and the source/drain layer on the black matrix layer locating within the plurality of non-opening regions of the black matrix layer; and
a passivation layer covering the source/drain layer.

13. The bottom-emitting substrate according to claim 12, further comprising: a color filter disposed on the array substrate unit and a transparent electrode layer disposed on the color filter.

14. A display device comprising the bottom-emitting substrate according to claim 12.

15. The bottom-emitting substrate according to claim 8, wherein in the black matrix layer, the plurality of non-opening regions are arranged in an array and the plurality of opening areas are arranged between the plurality of non-opening areas alternatively.

16. The bottom-emitting substrate according to claim 15, wherein the array substrate may further comprises:
gate lines and a gate layer disposed on the black matrix layer, projections of the gate lines and the gate layer on the black matrix layer locating within the plurality of non-opening regions of the black matrix layer;
a gate insulating layer covering the gate layer;
an active layer disposed on the gate insulating layer, projections of the active layer on the black matrix layer locating within the plurality of non-opening regionis of the black matrix layer;
data lines and a source/drain layer disposed on the active layer, projections of the data lines and the source/drain layer on the black matrix layer locating within the plurality of non-opening regions of the black matrix layer; and
a passivation layer covering the source/drain layer.

17. The bottom-emitting substrate according to claim 15, further comprising: a color filter disposed on the array substrate unit and a transparent electrode layer disposed on the color filter.

18. A display device comprising the bottom-emitting substrate according to claim 15.

* * * * *